United States Patent
Grunwald

(10) Patent No.: US 7,148,147 B2
(45) Date of Patent: Dec. 12, 2006

(54) CMP COMPOSITION CONTAINING ORGANIC NITRO COMPOUNDS

(75) Inventor: John Grunwald, Tel Aviv (IL)

(73) Assignee: J.G. Systems, Inc., Miami, FL (US)

( * ) Notice: Subject to any disclaimer, the term of this patent is extended or adjusted under 35 U.S.C. 154(b) by 0 days.

(21) Appl. No.: 11/243,563

(22) Filed: Oct. 5, 2005

(65) Prior Publication Data

US 2006/0027534 A1 Feb. 9, 2006

Related U.S. Application Data

(63) Continuation-in-part of application No. 10/430,910, filed on May 7, 2003, now Pat. No. 6,998,066.

(30) Foreign Application Priority Data

Mar. 6, 2003 (IL) ...................................... 154782

(51) Int. Cl.
*H01L 21/302* (2006.01)
*C09K 13/00* (2006.01)
*C09K 13/06* (2006.01)

(52) U.S. Cl. ..................... 438/692; 252/79.1; 252/79.4

(58) Field of Classification Search ................ 438/692; 252/79.1, 79.4

See application file for complete search history.

(56) References Cited

U.S. PATENT DOCUMENTS

| 3,738,858 | A | * | 6/1973 | Elwell et al. ................ 427/367 |
| 5,770,103 | A | * | 6/1998 | Wang et al. ................ 252/79.1 |
| 5,782,962 | A | * | 7/1998 | Burke et al. ................... 106/2 |
| 6,063,306 | A | * | 5/2000 | Kaufman et al. .......... 252/79.4 |
| 6,524,376 | B1 | * | 2/2003 | Aoki et al. ............... 106/14.42 |
| 2002/0016073 | A1 | | 2/2002 | Kondo et al. |

FOREIGN PATENT DOCUMENTS

JP 60032898 A 2/1985

* cited by examiner

*Primary Examiner*—Nadine Norton
*Assistant Examiner*—Lynette T. Umez-Eronini
(74) *Attorney, Agent, or Firm*—Carmody & Torrance LLP

(57) ABSTRACT

A composition and process for the precision polishing of substrates such as semi-conductor chips is disclosed. The composition and process make use of soluble or insoluble organic nitro compounds as oxidizers and/or abrasive particles. Nitrogen containing reduction products of the foregoing organic nitro compounds may also be included.

6 Claims, No Drawings

CMP COMPOSITION CONTAINING ORGANIC NITRO COMPOUNDS

This application is a continuation-in-part of application Ser. No. 10/430,910, filed May 7, 2003, now U.S. Pat. No. 6,998,066, the disclosure of which is incorporated herein in its entirety.

BACKGROUND OF THE INVENTION

Above-referenced pending application discloses incorporation of organic nitro compounds (ONCs) in slurries of chemical mechanical polishing (CMP) compositions. In a preferred embodiment, it favors soluble aromatic ONCs. Alternatively, insoluble aliphatic nitro derivatives, are proposed to be applied as emulsions.

This application further envisions use of ONCs both as sole oxidizers, or as auxiliary oxidant in presence of other oxidizers in the CMP composition.

PRIOR ART

The prior art reported hereafter, is referenced in addition to the prior art that has been described in pending parent application U.S. Ser. No. 10/430,910.

US 2002/0016073 A1 (Kondo) discloses a two-step CMP process, wherein one of the steps uses abrasive-free polishing solutions comprising water-soluble salts of aromatic nitro compounds in the presence of hydrogen peroxide, for etching barrier layers such as TiN. Kondo's preference for water-soluble salts of aromatic nitro compounds such as potassium and ammonium salts, as well as his exclusion of aromatic nitro compounds from abrasive-bearing polishing compositions, is in fact teaching away from the inventions disclosed herein. Indeed, unlike Kondo, this invention envisions embodying insoluble ONCs, either as particulate solids or by way of emulsions and microemulsions. Further, unlike Kondo, this invention envisions adding ONC's directly to the chemical mechanical polishing composition such that abrasive polishing and oxidation can occur in the same step.

U.S. Pat. No. 5,403,721 (Ward et al.), JP 60032898 and U.S. Pat. No. 6,709,316 (Sun et al.) are provided as further art. However, the prior art referenced, fails to teach the use of ONCs in abrasive-bearing CMP slurries, as taught and embodied by applicant.

Indeed, the prior art fails to recognize, let alone teach, use of emulsions and preferably microemulsions of water-insoluble or water-immiscible ONCs, and their incorporation into abrasive-bearing CMPs, or abrasive-free CMP compositions for improved polishing of LSI devices, especially for the minimization of copper dishing.

It is further noted that the prior art fails to suggest incorporation of solid, particulate ONCs into slurries of CMPs, where they can act as auxiliary mild abrasives, and at the same time will partially act as oxidizers at the wafer/slurry interface.

Furthermore, the prior art fails to teach, or even suggest, emulsification of insoluble or immiscible ONCs, as a way to promote their incorporation into CMP compositions for improved CMP processes.

DESCRIPTION OF THE INVENTION

This invention discloses the use of both aromatic and aliphatic ONCs in CMP slurries containing abrasives. It proposes pH ranges, and complexing agents for given types of ONCs. It also proposes emulsification as a way to address the problem of insoluble aliphatic ONCs.

In the case of insoluble solid ONCs, this invention proposes their dispersion as powders, where they can be co-dispersed with the abrasives of the slurry, and act as oxidants at the wafer/slurry interface, as needed. For example, m-nitro benzoates that are insoluble in an acid slurry, can be dispersed therein, as proposed above. In the case of sparcely soluble or water-immiscible ONCs, this invention, contemplates their inclusion in the CMP slurry compositions, in the form of emulsion or microemulsions.

The proposed improved embodiments of this invention will enable one skilled in the art to broaden and maximize benefits of CMP compositions and processes.

Thus, in addition to ONCs specified in above-referenced parent application, this invention proposes to incorporate into CMP compositions ONCs selected from naphthalene nitro compounds (NNCs), anthracene nitro compounds (ANCs), alone or in combination with other oxidants, or in combination of other ONCs whether aromatic or aliphatic. Further, instant application additionally proposes use of dinitro-ONCs, or polynitro ONCs in general, for enhanced oxidizing needs. Selection of polynitro ONC candidates will need to take into consideration safety and environmental aspects.

Also, this invention envisions use of intermediate reduction products (briefly referred to hereinafter as "intermediates") of ONCs. Some such intermediates will act in themselves as potential oxidizers, offering synergistically improved polishing action, especially as it relates to copper dishing. Examples of above intermediates comprise nitroso, azo, azoxy, diazo, and others. Some of the foregoing intermediates are quite complex structures, formed via in-situ condensation. Further, the above intended intermediates encompass both aliphatic and aromatic nitro compounds, the latter comprising nitrobenzene, nitronaphthalene, and nitroanthracene as well as partially reduced derivatives thereof. Partially reduced derivatives mean reduction products of the organic nitro compound, or intermediate, that remain capable of acting as an oxidizing agent for the surface being polished. For example, the reduction process of organic nitro compounds is believed to terminate with the formation of amines, which amines are no longer capable of accepting electrons or acting as an oxidant and such amines are thus not considered organic nitro compounds or effective intermediates thereof within this invention.

Instant application envisions the incorporation of ONC's or intermediates thereof into the CMP slurry compositions as sole oxidizing additives, or in addition to other oxidants, other ONCs, or in-situ intermediates already formed as reduction byproducts of ONCs that may be comprised in the CMP formulation.

At the risk of being redundant, it is again pointed out that one, can select candidates of such intermediates from the vast offerings of the dye industry in general, and diazo dyes in particular. Optimization of optimal type, quantity, etc. of intermediate(s) to be added to a given CMP composition, will be determined based upon the actual composition and the substrate to be polished.

In addition to their oxidizing properties, such intermediates, many of them colored dyes, can potentially serve for improved and easier CMP end-point detection, as they tend to be adsorbed to the surface undergoing polishing. Indeed, end-point detection is a critical and yet not totally satisfied industry need.

Again, instant application further contemplates use of water soluble solid intermediates, water-insoluble intermediates that can blend-in with the slurry, as well as water insoluble or water immiscible intermediates that can be emulsified and then added to the CMP composition as emulsion or microemulsion.

It is further proposed that certain ONCs, and/or intermediates can act as corrosion inhibitors, complementing, or replacing benzotriazole type compounds commonly used for polishing copper interconnect LSI devices.

In offering a vast array of ONCs to choose from, instant application affords selection of ONC or intermediate, to suit any given slurry composition, making the ONC additive adaptable to any slurry environment, such as pH, temperature, complexing agent, etc.

This invention envisions periodically, and intermittently interrupting mechanical abrasion, allowing the oxidants in the slurry to act solely as a chemical polishing media, without concomitant abrasion.

Again, in differentiation from the prior art, and specifically Kondo, this application envisions using emulsion ONCs for abrasive-free CMP compositions, and potentially excluding soluble aromatic nitro compounds from such CMP formulations.

It is noted that emulsions, especially microemulsions are dispersed, high surface-energy particles, whose powerful interfacial activity affords the use of significantly lower ONC bulk concentrations for a given oxidizing effect at the wafer/slurry interface, as compared to concentrations needed with water-soluble ONCs. Using lower ONC concentrations leads to cost advantages, and environmental benefits.

This application envisions both oil in water and water in oil emulsions, though oil in water emulsions, especially microemulsions, will be often favored for their ease of preparation and potentially greater stability.

Further, a preferred embodiment of this invention, in addition to the aqueous based abrasive-bearing dispersions, emulsions or microemulsions described previously, comprises gels or pastes of organic nitro compounds, with or without abrasive particulate contained therein. The gel or paste form offers particular benefits when polishing surfaces with polishing pads that have fixed abrasives on their surface.

This invention proposes the use of chemical mechanical polishing compositions comprising:
  (i) abrasive particulate
  (ii) water
  (iii) organic nitro compounds
  (iv) optionally, one or more materials selected from the group consisting of surfactants, emulsifiers, chelators and thickeners.
  (v) optionally, reduction products of the foregoing organic nitro compounds such as nitroso compounds, azo compounds, azoxy compounds and diazo compounds.

The abrasive particles useful in this invention include silicon carbide, silica, alumina, ceria, other similar abrasive particles and mixtures thereof. Generally the concentration of abrasive particles in the chemical mechanical polishing composition ranges from about 0.1 to 20 percent by weight.

The organic nitro compounds useful in this invention include both (i) ONC's that are soluble in the matrix of the CMP composition and (ii) ONC's that are insoluble, sparingly soluble or immicible in the CMP composition. From a variety of perspectives, ONC's that are insoluble or sparingly soluble or immiscible in the matrix may be preferable for the following reasons:

1. the insoluble portion of the ONC's can remain as particulate in the CMP composition and thereby aide as the sole or additional abrasive particles in the composition;
2. the insoluble portion leaves a reservoir of the ONC that can slowly dissolve in the CMP composition as the concentration of the ONC in the CMP composition drops with use;
3. the insoluble portion of the ONC can be emulsified in the CMP composition, thereby forming a suspension of the ONC in the CMP composition.

For clarification, insoluble, sparingly soluble or immicible as used herein in respect of organic nitro compounds mean that the organic nitro compound is used in the CMP composition at a concentration higher than the equilibrium solubility (or miscibility) concentration for that ONC under the conditions of use of the CMP composition such that a portion of the ONC remains undissolved or immicible. On the other hand, a soluble or miscible ONC would be one that, at the concentration used in the CMP composition under normal use conditions, is completely soluble or miscible in the CMP matrix. In some cases it may be advantageous to utilize a mixture of soluble ONC's and insoluble or sparingly soluble ONC's in the CMP composition.

Organic nitro compounds which are soluble or miscible under normal working conditions in typical aqueous CMP compositions include the following (ortho, para, or meta) nitro benzene sulfonates, (ortho, para, or meta) nitro benzoates, (ortho, para, or meta) nitrohydroxylates sulfonated nitro paraffins, carboxylated nitro paraffins, hydroxylated nitro paraffins and the like. Organic nitro compounds which are insoluble, sparingly soluble or immicible in typical acqueous CMP compositions under normal working conditions include nitro paraffins, (meta, ortho or para) nitrobenzene, nitro naphthalene, nitro anthracene, as well as the dinitro and polynitro forms of any of the foregoing.

If insoluble, sparingly soluble or immicible organic nitro compounds are used, it may be beneficial to employ surfactants or emulsifiers in the CMP composition in order to create an emulsion or suspension of the insoluble or immicible portion in the CMP matrix. Typical surfactants or emulsifiers useful in this invention include the TRITON® series from Rohm & HAAS, the IGEPAL® series from BASF, the BENAX® series from Dow, the SURFYNOL® series from Air Products, the ARILANE® series from Diamond Shamrock and others.

Chelators, preferable amines or ammonia compounds such as ammonia or ethylene diamine tetra acetic acid may be employed in the CMP composition in order to maintain dissolved metals in solution. The concentration of chelator may be maintained or increased with use of the CMP composition.

In addition to organic nitro compounds, it may be beneficial to include reduction products of the organic nitro compounds in the CMP composition. These reduction products can be directly added to the CMP composition or can be created in site or via reduction of the organic nitro compounds in the CMP composition. These reduction compounds (or intermediates) are frequently dyes or highly colored compounds. Their inclusion in the CMP composition can be useful for two reasons:

1. They can act as auxiliary oxidizing compounds; Since they are highly colored, they can be observed to be absorbed into or absorbed onto the surface of the part being polished. This colored absorption or adsorption can provide optical resolution showing differences in the degree of polishing across the surfaces. As a result, these reduction products can assist in determining the end point of polishing. Organic nitro reduction products (intermediates) useful in this invention include nitroso compounds, azo compounds, azoxy compounds, and diazo compounds. Specifically such useful eater soluble reduction products include diazo, azoxy, azo nitroso derivatives of benzene, naphthalene, and anthracene. Any of the foregoing may also comprise multiple nitro, diazo, azoxy, azo or nitroso groups. Generally water insoluble or immiscible intermediates can be selected from the foregoing by excluding the solubilizing hydroxyl, sulfonate and/or carboxy groups.

I claim:

1. A method of polishing a substrate, said method comprising contacting the substrate with a polishing pad and a polishing composition wherein the polishing pad is in motion relative to the substrate and wherein the polishing composition comprises:
   a. abrasive particulate;
   b. water;
   c. organic nitro compounds;
   wherein the composition also comprises a nitrogen containing compound selected from the group consisting of nitroso compounds, azo compounds, azoxy compounds and diazo compounds.

2. A method according to claim 1 wherein the composition also comprises one or more materials selected from the group consisting of surfactants, emulsifiers, chelators and thickeners.

3. A method according to claim 1 wherein at least a portion of the organic nitro compound in the composition remains insoluble or immiscible in an aqueous portion of the composition.

4. A method according to claim 3 wherein the composition comprises a suspension or an emulsion.

5. A method according to claim 4 wherein the composition also comprises one or more materials selected from the group consisting of surfactants, emulsifiers, chelators and thickeners.

6. A method according to claim 1 wherein the nitrogen containing compound comprises a dye.

* * * * *